(12) United States Patent
Raniwala et al.

(10) Patent No.: US 9,978,147 B2
(45) Date of Patent: May 22, 2018

(54) SYSTEM AND METHOD FOR CALIBRATION OF A DEPTH CAMERA SYSTEM

(71) Applicant: Intel Corporation, Santa Clara, CA (US)

(72) Inventors: Sundeep Raniwala, Folsom, CA (US); Bidhan P. Chaudhuri, Santa Clara, CA (US); Anders Grunnet-Jepsen, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 211 days.

(21) Appl. No.: 14/998,149

(22) Filed: Dec. 23, 2015

(65) Prior Publication Data

US 2017/0186146 A1 Jun. 29, 2017

(51) Int. Cl.
*G06T 7/00* (2017.01)
*H04N 13/02* (2006.01)
*H01S 5/183* (2006.01)

(52) U.S. Cl.
CPC ............ *G06T 7/002* (2013.01); *G06T 7/0057* (2013.01); *H01S 5/183* (2013.01); *H04N 13/025* (2013.01); *H04N 2213/003* (2013.01)

(58) Field of Classification Search
CPC ...... G06T 7/002; G06T 7/0057; H04N 13/025; H04N 2213/003; H01S 5/183
See application file for complete search history.

(56) References Cited

U.S. PATENT DOCUMENTS

| | | | |
|---|---|---|---|
| 2011/0025827 A1* | 2/2011 | Shpunt | H04N 13/0239 348/47 |
| 2012/0051588 A1* | 3/2012 | McEldowney | G03B 17/54 382/103 |
| 2014/0184751 A1* | 7/2014 | Liou | H04N 13/0239 348/47 |
| 2015/0288951 A1* | 10/2015 | Mallet | H04N 17/002 348/46 |

* cited by examiner

*Primary Examiner* — Huy T Nguyen
(74) *Attorney, Agent, or Firm* — Womble Bond Dickinson (US) LLP (57) ABSTRACT

A method and apparatus for performing inbuilt calibration of camera system that performs three-dimensional measurements and depth reconstruction are described. In one embodiment, the method includes displaying, using a projector of a capture device, a fiducial projection pattern in response to calibration of the capture device. The method may also include capturing, with a camera of the capture, an image of the fiducial projection pattern. The method may also include determining calibration coefficient values indicative of relative physical relationships of one or more components of the depth camera system based on analysis of the captured image of the fiducial projection pattern.

20 Claims, 6 Drawing Sheets

SYSTEM AND METHOD FOR CALIBRATION OF A DEPTH CAMERA SYSTEM

FIELD

Embodiments of the present invention relate to the field of camera systems that perform three-dimensional (3-D) measurements; more particularly, embodiments of the present invention relate to performing inbuilt calibration of such camera systems.

BACKGROUND

Stereo depth cameras are well-known and are often used to measure a distance from an object. One such measurement device includes a projector and a camera. In such a device, the projector projects a more or less random pattern image on an object (e.g., a scene), and an image of the object upon which the image is projected is captured by the camera. From the captured images, depth information may be determined. One technique for determining depth in such devices is through the use of triangulation. Thus, images of objects are captured and measurements are taken to determine depth information.

There is need to calibrate the relationship of intrinsic and extrinsic geometric parameters of an active coded light passive triangulation. Typically, the process is performed once on a per-unit basis during the assembly process. However, the ability to properly determine the position of objects captured by stereo depth camera systems is sensitive to micron levels of relative movement between an IR projector, IR camera, and RGB camera. This means a stereo depth camera system may lose calibration after the initial calibration due to temperature changes, after a user has dropped the system causing relative movements of one or more components, when the system has been bent, etc.

For the stereo depth camera system to be recalibrated, after one or more of the events discussed above, a special chart is presented to the camera system, images of the special chart captured, and the new calibration values obtained. Thus, recalibration may be difficult, impractical, or overly time consuming when a user of the system does not have the reference chart, or must generate the special chart in order to perform the recalibration.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
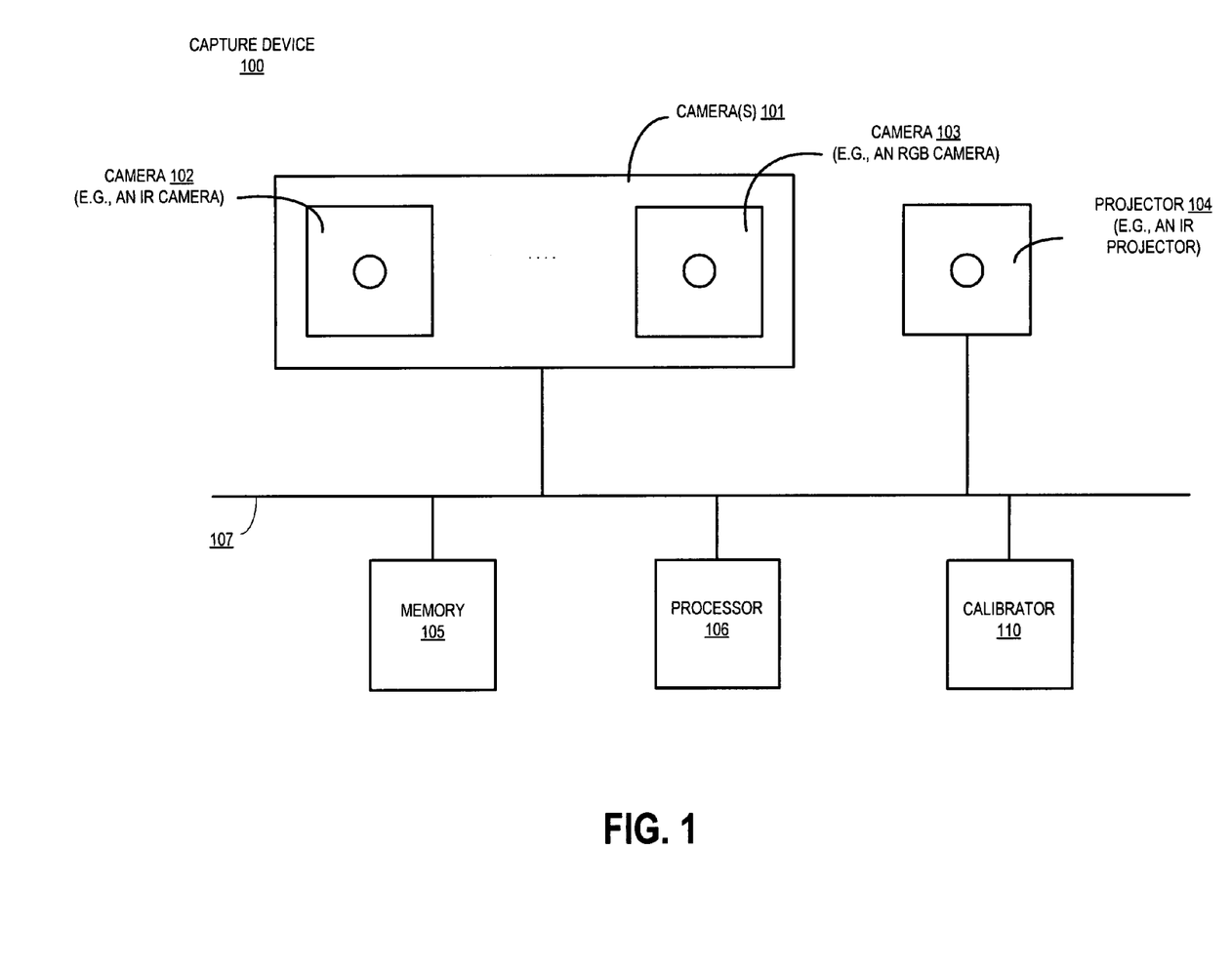
FIG. 1 illustrates one embodiment of a depth camera system for performing an inbuilt calibration process.

FIG. 1 illustrates one embodiment of a depth camera system, such as an active coded light triangulation system. In embodiments of an active coded light triangulation system, the system can include coded light range cameras operating by projecting a sequence of one-dimensional binary ("black" and "white") patterns onto a scene, such that the produced binary code encodes the angle of the projection plane. Depth is then reconstructed by triangulation consisting of computing the intersection of an imaginary ray emanating from the camera with the plane emanating from the projector.

Referring to FIG. 1, capture device 100 may include a 3D scanner, a 3D camera or any other device configured for a 3D object acquisition. In some embodiments, as illustrated, capture device 100 includes an image capturing device 102 (e.g., a digital camera) and a projector unit 104, such as a laser projector or laser scanner, having a number of components. In some embodiments, digital camera 102 may comprise an infrared (IR) camera, and the projector unit 104 may comprise an IR projector.

Projector unit 104 is configured to project a light pattern as described herein and may comprise a one-dimensional code projector. In one embodiment, the light patterns comprise one-dimensional coded light patterns, e.g., the patterns that may be described by one-dimensional or linear codes. The light patterns formed by the laser planes on a surface of the object may be received by image capturing device 102 and sensed (e.g., read) by a sensor of image capturing device 102. Based on the readings of the multiple scans of the light patterns accumulated during a sensing cycle of the sensor, capture device 100 may be configured to reconstruct the shape of the object.

In some embodiments, capture device 100 may further include another image capturing device, such as digital camera 103. In some embodiments, digital camera 103 may have a resolution that is different than that of digital camera 103. For example, digital camera 102 may be a multichromatic camera, such as red, green, and blue (RGB) camera configured to capture texture images of an object.

Capture device 100 may further include a processor 106 that may be in operative communication with the image camera component 101 over a bus or interconnect 107. Processor 106 may include a standardized processor, a specialized processor, a microprocessor, or the like that may execute instructions that may include instructions for generating depth information, generating a depth image, determining whether a suitable target may be included in the depth image, or performing other operations described herein.

Processor 106 may be configured to reconstruct the object based on the images captured by digital camera 102, for example, using geometry techniques or other techniques used for 3D image reconstruction. Processor 106 may be further configured to distortions in the reconstructed image of the object or depth calculations that may be caused, for example, by various external factors (e.g., temperature, dropping, bending, etc.).

Capture device 100 may further include a memory 105 that may store the instructions that may be executed by processor 106, images or frames of images captured by the cameras, user profiles or any other suitable information, images, or the like. According to one example, memory 105 may include random access memory (RAM), read only memory (ROM), cache, Flash memory, a hard disk, or any other suitable storage component. As shown in FIG. 1, memory component 105 may be a separate component in communication with the cameras 101 and processor 106. Alternatively, memory 105 may be integrated into processor 106 and/or the image capture cameras 101. In one embodiment, some or all of the components 102-106 are located in a single housing.

Processor 105, memory 104, other components (not shown), image capturing device 102, and projector unit 104 may be coupled with one or more interfaces (not shown) configured to facilitate information exchange among the above-mentioned components. Communications interface(s) (not shown) may provide an interface for device 100 to communicate over one or more wired or wireless network(s) and/or with any other suitable device. In various embodiments, capture device 100 may be included in or associated with, but is not limited to, a server, a workstation, a desktop computing device, or a mobile computing device (e.g., a laptop computing device, a handheld computing device, a handset, a tablet, a smartphone, a netbook, ultrabook, etc.).

In one embodiment, capture device 100 is integrated into a computer system (e.g., laptop, personal computer (PC), etc.). However, capture device 100 can be alternatively configured as a standalone device that is couplable to such a computer system using conventional technologies including both wired and wireless connections.

In various embodiments, capture device 100 may have more or less components, and/or different architectures. For example, in some embodiments, capture device 100 may include one or more of a camera, a keyboard, display such as a liquid crystal display (LCD) screen (including touch screen displays), a touch screen controller, non-volatile memory port, antenna or multiple antennas, graphics chip, ASIC, speaker(s), a battery, an audio codec, a video codec, a power amplifier, a global positioning system (GPS) device, a compass, an accelerometer, a gyroscope, and the like. In various embodiments, capture device 100 may have more or less components, and/or different architectures. In various embodiments, techniques and configurations described herein may be used in a variety of systems that benefit from the principles described herein.

Capture device 100 may be used for a variety of purposes, including, but not limited to, being part of a target recognition, analysis, and tracking system to recognize human and non-human targets in a capture area of the physical space without the use of special sensing devices attached to the subjects, uniquely identify them, and track them in three-dimensional space. Capture device 100 may be configured to capture video with depth information including a depth image that may include depth values via any suitable technique including, for example, triangulation, time-of-flight, structured light, stereo image, or the like.

Capture device 100 may be configured to operate as a depth camera that may capture a depth image of a scene. The depth image may include a two-dimensional (2D) pixel area of the captured scene where each pixel in the 2D pixel area may represent a depth value such as a distance in, for example, centimeters, millimeters, or the like of an object in the captured scene from the camera. In this example, capture device 100 includes an IR light projector 404, an IR camera 102, and a visible light RGB camera 103 that are configured in an array.

Various techniques may be utilized to capture depth video frames. For example, capture device 100 may use structured light to capture depth information. In such an analysis, patterned light (i.e., light displayed as a known pattern such as a grid pattern or a stripe pattern) may be projected onto the capture area via, for example, IR light projector 104. Upon striking the surface of one or more targets or objects in the capture area, the pattern may become deformed in response. Such a deformation of the pattern may be captured by, for example, the IR camera 102 and/or the RGB camera 103 and may then be analyzed to determine a physical distance from capture device 100 to a particular location on the targets or objects.

Capture device 100 may utilize two or more physically separated cameras that may view a capture area from different angles, to obtain visual stereo data that may be resolved to generate depth information. Other types of depth image arrangements using single or multiple cameras can also be used to create a depth image.

Capture device 100 may provide the depth information and images captured by, for example, IR camera 102 and/or the RGB camera 103, including a skeletal model and/or facial tracking model that may be generated by capture device 100, where the skeletal and/or facial tracking models, depth information, and captured images are used to, for example, create a virtual screen, adapt the user interface, and control an application.

In embodiments, capture device 100 may comprise a projector unit 104, a digital camera (e.g., IR camera) 102, another digital camera (e.g., multi-chromatic camera) 103, and a processor (controller) configured to operate capture device 100 according to the embodiments described herein. However, the above assembly configuration is described for illustration purposes only, and is should not be limiting to the present disclosure. Various configurations of an assembly for a 3D object acquisition may be used to implement the embodiments described herein. For example, an assembly for a 3D object acquisition configured to enable the reconstructed object distortion corrections may include three digital cameras, two of which may be used to reconstruct a 3D image of an object, and the third camera (e.g. with a resolution that is different than those of the two cameras) may be used to capture images of the object in order to identify image distortions in the reconstructed object and to compensate for identified distortions.

The depth reconstruction performed by capture device 100 relies on several calibration coefficients that describe the physical relationship between the projector(s) (e.g., projector 104), camera(s) (e.g., cameras 102 and 103), and/or other components of the capture device 100. The calibration coefficients could represent physical or computational distances, angles, orientations, offsets, timing differentials, etc. of the components of the capture device 100 relative to one another, and which aid in the generation of depth information. These calibration coefficients are typically initially set during a calibration process performed when assembling the capture device 100. In embodiments, while physical relationships between the capture device 100 components remains unchanged, the coefficients can be used by capture device 100 to accurately perform depth reconstruction from captured image data. However, due to factors such as temperature changes, movement, bending, or other damage to capture device 100 as a result of a user dropping the device, system bending, etc., the actual physical relationships between the capture device 100 components diverge from the calibrated coefficient values, thus leading to inaccurate and/or useless depth reconstruction data.

In one embodiment, capture device 100 includes a calibrator 110 for recalculating the coefficients that describe the physical relationships between capture device 110 components, and which enable capture device 100 to perform depth reconstruction. In embodiments, calibrator 110 is a processing logic that may comprise hardware (circuitry, dedicated logic, etc.), software (such as is run on a general purpose computer system, a dedicated machine, stored in memory 105 and executed by processor 106, etc.), firmware, or a combination thereof.

In one embodiment, calibrator 110 performs calibration of the capture device's 100 calibration coefficients by utilizing projector 104 to display one or more fiducial images, such as a known image or projector pattern having known characteristics, on a scene. Furthermore, when the projector 104 is an IR projector, the fiducial image is invisible to a user of capture device. The fiducial image projected by projector 104 is a known reference image that enables calibrator 110 to capture one or more images of the fiducial image using one or more camera(s) 101, calculate new calibration coefficient values, and apply those values when performing depth reconstruction. In one embodiment, an IR projector can display the fiducial image(s) onto any flat surface (such as a wall) as well as textured surfaces. Furthermore, no special pattern or printout need be obtained, generated, or physically placed in front of the camera(s) 101.

Figure 3:
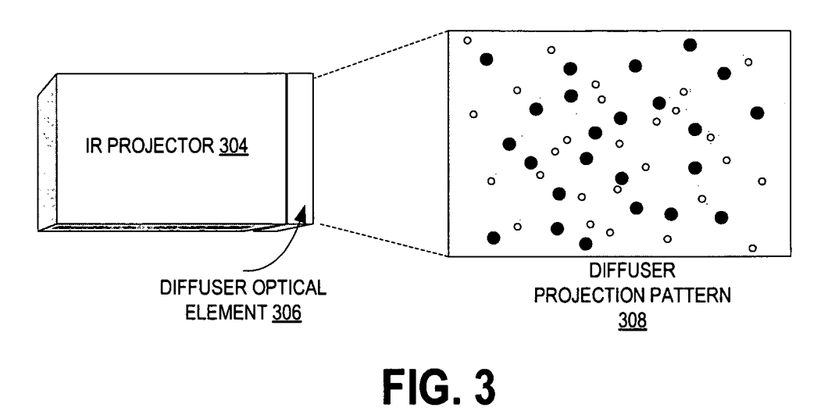
FIG. 3 illustrates one embodiment of an IR projector of the depth camera system displaying a fiducial image for performing a calibration process.

In one embodiment, projector 104 is an IR projector configured to display the fiducial image used by calibrator 110. FIG. 3 provides additional details for the projector 104 of FIG. 1 displaying a first type of fiducial image. In the embodiment illustrated in FIG. 3, an IR projector 304 includes a diffuser optical element 306 arranged on top of the projector 304. The diffuser optical element 306 is a film, plate, or other mechanism that, when placed over the IR projector 304, spreads out or scatters the light generated by IR projector 304. In one embodiment, the diffuser optical element 306 may be configured to produce spots on a scene as the fiducial image, when placed over a projection part of the IR projector 304, thereby causing the display of spots having a known diffuser projection pattern 308. In one embodiment, by tuning the spot sizes of the diffuser optical element 306, IR projector 304 projects IR spots which are brighter than surrounding spots in diffuser projection pattern 308. This can be used to create a pattern of bright spots. The pattern thereafter becomes the known fiducial image enabling calculation of new calibration coefficient values by calibrator 110 of FIG. 1.

Figure 4:
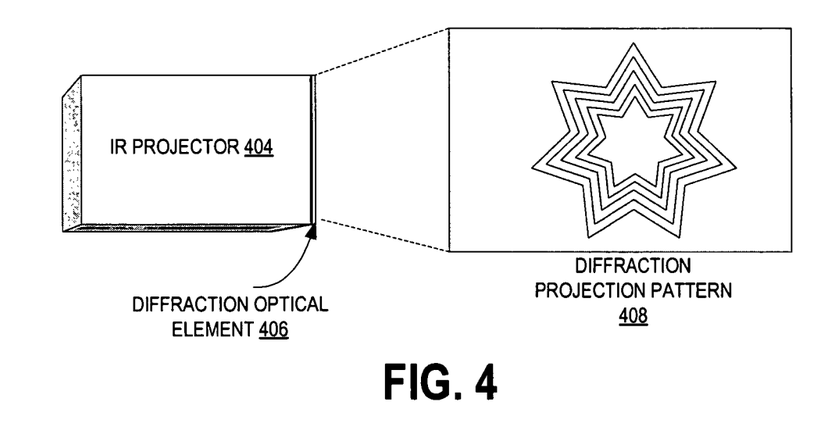
FIG. 4 illustrates another embodiment of an IR projector of the depth camera system displaying a fiducial image for performing a calibration process.

In another embodiment, projector 104 is an IR projector configured to display the fiducial image used by calibrator 110. FIG. 4 provides additional details for another embodiment of the projector 104 of FIG. 1, which displays a second type of fiducial image. In the embodiment illustrated in FIG. 4, an IR projector 404 includes a diffraction optical element 406. The diffraction optical element may be a lens, covering, or other object coupled to the IR projector 404, or may be disposed over the IR projector 404 similar the diffuser optical element of FIG. 3. In one embodiment, diffraction optical element 406 is a glass element etched with a diffraction patter. When the projector 404 displays an image through the diffraction optical element 406, the diffraction projection pattern 408 is displayed upon a scene. The diffraction projection pattern 408 becomes the known fiducial image enabling calculation of new calibration coefficient values by calibrator 110 of FIG. 1.

Figure 5:
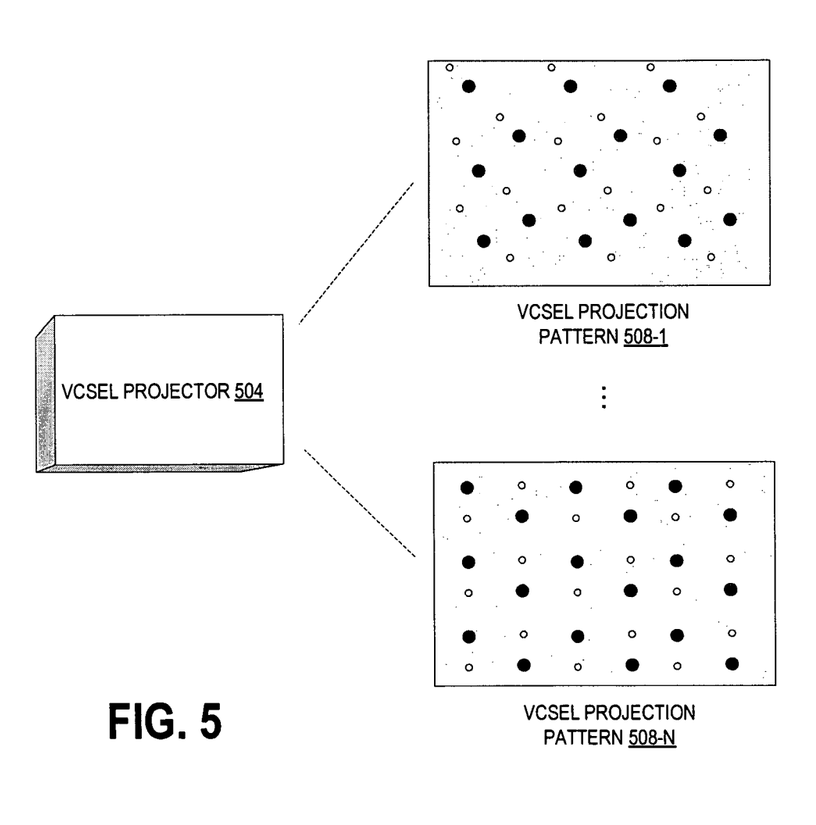
FIG. 5 illustrates another embodiment of an IR projector of the depth camera system displaying a fiducial image for performing a calibration process.

In yet another embodiment, projector 104 is vertical-cavity surface-emitting laser (VCSEL) configured to display the fiducial image used by calibrator 110. FIG. 5 provides additional details for yet another embodiment of the projector 104 of FIG. 1, which displays a third type of fiducial image. Furthermore, in one embodiment, VCSEL projector 504 may be configured and/or controlled by calibrator 110 to generate and display a series of fiducial images. VSCSEL projector 504 is a semiconductor laser with a plurality of JR emission light sources arranged as a grid, columns, rows, etc., and which are perpendicular from the projection part of the VCSEL projector 504. Furthermore, each emission source of VCSEL projector 504 can be individually controlled by VCSEL projector 504 to provide pixel level of the output from each emission light source. For example, VCSEL projector 504 may turn individual laser emission sources on or off, control the power supplied to the source impacting brightness, create multiple patterns, etc. In one embodiment, calibrator 110 may configure VCSEL projector 504 to output a single precise VCSEL pattern, such as VCSEL projector pattern 508-1, or two or more precise VCSEL patterns, such as VCSEL projector patterns 508-1 through 508-N. The VCSEL projector pattern(s) are similar to the diffuser projection pattern 308 illustrated in FIG. 3. In one embodiment, the usage of multiple different VCSEL projector patterns enables calibrator 110 to computer an initial set of new calibration values, refine those calibration values as other VCSEL projector patterns are displayed, and ultimately arrive at the new calibration coefficient values. The VCSEL projection pattern(s) become the known fiducial image(s) enabling calculation of new calibration coefficient values by calibrator 110 of FIG. 1.

In embodiments, capture device 100 may include one or more of the IR projectors illustrated in FIGS. 3-5. These IR projectors enable capture device 100 to display a known fiducial image that enables calibrator 110 to recalculate calibration values when needed by the capture device. Furthermore, the IR projector(s) display the calibration images invisible to a user, and can project the fiducial images on flat and/or uneven surfaces. For example, IR projector 304 of FIG. 3 may display the diffuser projection pattern 308 of diffuser optical element 306 on a flat surface, such as a white, or other colored, wall in order to perform a calibration process. As another example, IR projector 504 of FIG. 5 may display a sequence of precise VCSEL projector patterns based on the control of calibrator 110, such as patterns 508-1 through 508-N, onto an uneven surface in order to perform a calibration process. As yet another example, capture device 100 may include more than one projector, such as any combination of IR projectors 304, 404, and 504 in order to perform multiple calibration processes utilizing different techniques.

In embodiments, the calibration process performed by calibrator 110 utilizing one or more of the IR projectors of FIGS. 3-5 may be initiated in response to a user request. However, calibrator 110 may inform a user of capture device 100 that a calibration may be needed in response to detecting one or more predetermined events, such as detecting accelerations experienced by capture device 100 above a threshold value, detecting temperature changes and/or cycles that exceed greater than a threshold value, after passage of a threshold length of time, or in response to other scenarios that might require recalibration of the capture device calibration coefficient values. In one embodiment, calibrator 110 detects these scenarios by monitoring one or more sensors (not shown), such as accelerometers, gyroscopes, temperature sensors, light sensors, etc., coupled with capture device 100. In another embodiment, calibrator 110 may receive notice from processor that one of the above described events has occurred. In embodiments, calibrator 110 may independently activate a calibration process, without user intervention, in response to detection or notification of one of the above scenarios.

Figure 2:
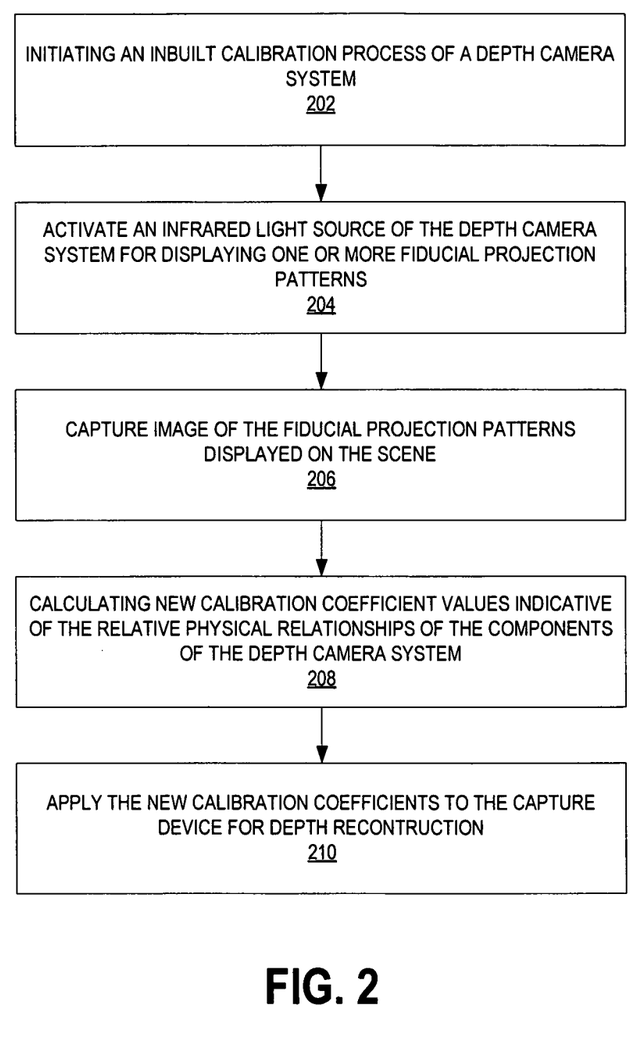
FIG. 2 is a flow diagram of one embodiment of a calibration process performed by a depth camera system.

FIG. 2 is a flow diagram of one embodiment of a calibration process performed by a depth camera system. The process is performed by processing logic that may comprise hardware (circuitry, dedicated logic, etc.), software (such as is run on a general purpose computer system or a dedicated machine), firmware, or a combination of these three.

Referring to FIG. 2, the processing begins by initiating an inbuilt calibration process of a depth camera system, such as capture device 100 of FIG. 1 (processing block 202). In one embodiment, the calibration process is referred to as inbuilt because the calibration can be performed without utilizing external resources, such as specialized printed out target images or patterns. Furthermore, the calibration process can be initiated in response to a user request to perform a calibration, or, initiated or indicated by processing logic in response to detecting one or more events (e.g., detecting thermal cycling, user dropping the depth camera system, detecting system bending).

Processing logic activates an infrared light source of the depth camera system for displaying one or more fiducial projection patterns (processing block 204). In embodiments, the infrared light source is one or more infrared projector(s), such as those illustrated and discussed above in FIGS. 3-5. The infrared light source displays the fiducial projection pattern(s) as known image(s) on a scene, which are captured by processing logic (processing block 206). From the captured images of the fiducial pattern(s), calibration coefficient values indicative of the relative physical relationships of the components (e.g., cameras and projectors) can be calculated by processing logic (processing block 208). In one embodiment, the fiducial image(s) are captured by cameras of the depth camera system, intermediate values (e.g., brightness, intensity, relative distance, etc.) determined from the displayed pattern, and the calibration coefficient values calculated from the intermediate values.

Processing logic applies the new calibration coefficient values to capture device to enable capture device to accurately perform depth reconstruction as discussed herein (processing block 210).

Figure 6:
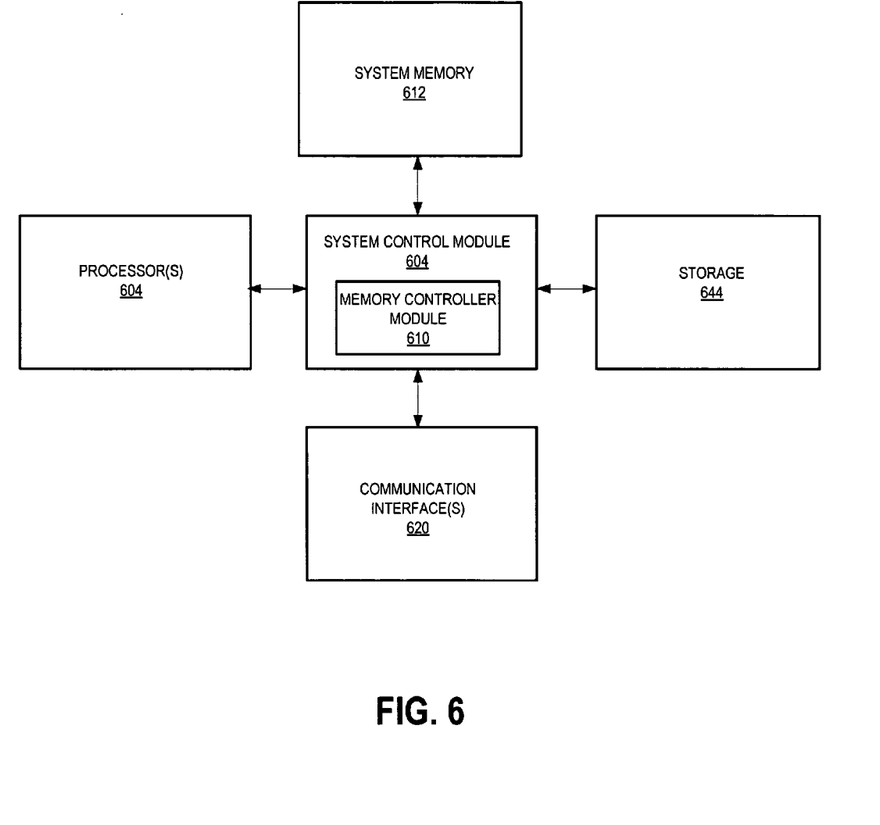
FIG. 6 is a block diagram of one embodiment of a system.

FIG. 6 illustrates, for one embodiment, an example system 600 having one or more processor(s) 604, system control module 608 coupled to at least one of the processor(s) 604, system memory 612 coupled to system control module 608, non-volatile memory (NVM)/storage 614 coupled to system control module 608, and one or more communications interface(s) 620 coupled to system control module 608. In some embodiments, the system 600 may include capture device 100 and provide logic/module that performs functions aimed to capture device 100 calibrations, along with depth reconstruction and other functions, described herein.

In some embodiments, the system 600 may include one or more computer-readable media (e.g., system memory or NVM/storage 614) having instructions and one or more processors (e.g., processor(s) 604) coupled with the one or more computer-readable media and configured to execute the instructions to implement a module to perform depth and texture calibration, along with depth reconstruction and other functions, described herein.

System control module 608 for one embodiment may include any suitable interface controllers to provide for any suitable interface to at least one of the processor(s) 604 and/or to any suitable device or component in communication with system control module 608.

System control module 608 may include memory controller module 610 to provide an interface to system memory 612. The memory controller module 610 may be a hardware module, a software module, and/or a firmware module. System memory 612 may be used to load and store data and/or instructions, for example, for system 600. System memory 612 for one embodiment may include any suitable volatile memory, such as suitable DRAM, for example. System control module 608 for one embodiment may include one or more input/output (I/O) controller(s) to provide an interface to NVM/storage 614 and communications interface(s) 620.

The NVM/storage 614 may be used to store data and/or instructions, for example. NVM/storage 614 may include any suitable non-volatile memory, such as flash memory, for example, and/or may include any suitable non-volatile storage device(s), such as one or more hard disk drive(s) (HDD(s)), one or more compact disc (CD) drive(s), and/or one or more digital versatile disc (DVD) drive(s), for example. The NVM/storage 614 may include a storage resource physically part of a device on which the system 600 is installed or it may be accessible by, but not necessarily a part of, the device. For example, the NVM/storage 614 may be accessed over a network via the communications interface(s) 620.

Communications interface(s) 620 may provide an interface for system 600 to communicate over one or more network(s) and/or with any other suitable device. The system 600 may wirelessly communicate with the one or more components of the wireless network in accordance with any of one or more wireless network standards and/or protocols.

For one embodiment, at least one of the processor(s) 604 may be packaged together with logic for one or more controller(s) of system control module 608, e.g., memory controller module 610. For one embodiment, at least one of the processor(s) 604 may be packaged together with logic for one or more controllers of system control module 608 to form a System in Package (SiP). For one embodiment, at least one of the processor(s) 604 may be integrated on the same die with logic for one or more controller(s) of system control module 608. For one embodiment, at least one of the processor(s) 604 may be integrated on the same die with logic for one or more controller(s) of system control module 608 to form a System on Chip (SoC).

In various embodiments, the system 600 may have more or less components, and/or different architectures. For example, in some embodiments, the system 600 may include one or more of a camera, a keyboard, liquid crystal display (LCD) screen (including touch screen displays), non-volatile memory port, multiple antennas, graphics chip, application-specific integrated circuit (ASIC), and speakers.

In various implementations, the system 600 may be, but is not limited to, a mobile computing device (e.g., a laptop computing device, a handheld computing device, a tablet, a netbook, etc.), a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 600 may be any other electronic device.

Figure 7:
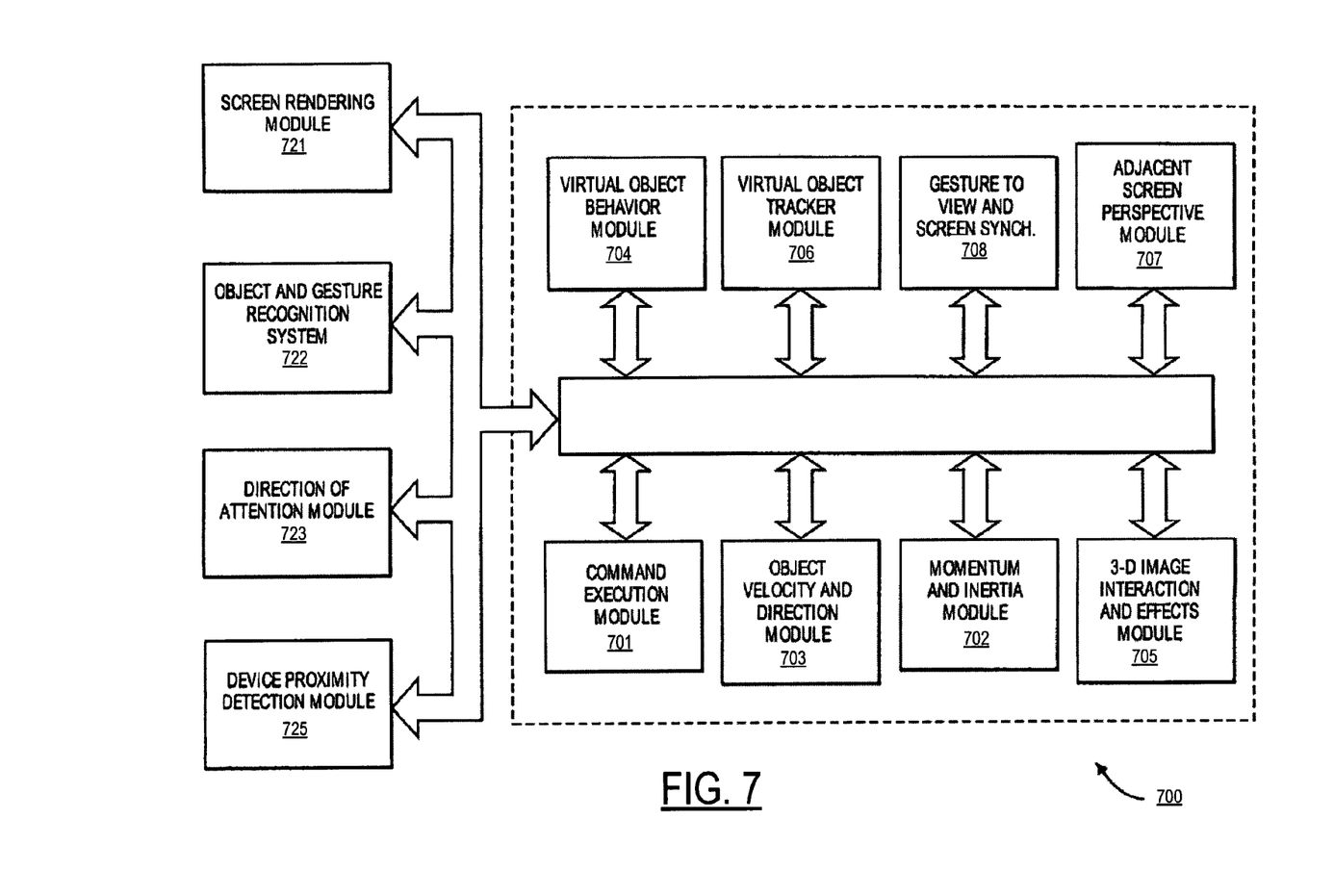
FIG. 7 illustrates an embodiment of a computing environment capable of supporting the operations discussed above.

FIG. 7 illustrates an embodiment of a computing environment 700 capable of supporting the operations discussed above. The modules described before can use the depth information (e.g., values) and other data described above to perform these functions. The modules and systems can be implemented in a variety of different hardware architectures and form factors.

Command Execution Module 701 includes a central processing unit to cache and execute commands and to distribute tasks among the other modules and systems shown. It may include an instruction stack, a cache memory to store intermediate and final results, and mass memory to store applications and operating systems. Command Execution Module 701 may also serve as a central coordination and task allocation unit for the system.

Screen Rendering Module 721 draws objects on the one or more multiple screens for the user to see. It can be adapted to receive the data from Virtual Object Behavior Module 704, described below, and to render the virtual object and any other objects and forces on the appropriate screen or screens. Thus, the data from Virtual Object Behavior Module 704 would determine the position and dynamics of the virtual object and associated gestures, forces and objects, for example, and Screen Rendering Module 721 would depict the virtual object and associated objects and environment on a screen, accordingly. Screen Rendering Module 721 could further be adapted to receive data from Adjacent Screen Perspective Module 707, described below, to either depict a target landing area for the virtual object if the virtual object could be moved to the display of the device with which Adjacent Screen Perspective Module 707 is associated. Thus, for example, if the virtual object is being moved from a main screen to an auxiliary screen, Adjacent Screen Perspective Module 707 could send data to the Screen Rendering Module 721 to suggest, for example in shadow form, one or more target landing areas for the virtual object on that track to a user's hand movements or eye movements.

Object and Gesture Recognition System 722 may be adapted to recognize and track hand and harm gestures of a user. Such a module may be used to recognize hands, fingers, finger gestures, hand movements and a location of hands relative to displays. For example, Object and Gesture Recognition System 722 could for example determine that a user made a body part gesture to drop or throw a virtual object onto one or the other of the multiple screens, or that the user made a body part gesture to move the virtual object to a bezel of one or the other of the multiple screens. Object and Gesture Recognition System 722 may be coupled to a camera or camera array, a microphone or microphone array, a touch screen or touch surface, or a pointing device, or some combination of these items, to detect gestures and commands from the user.

The touch screen or touch surface of Object and Gesture Recognition System 722 may include a touch screen sensor. Data from the sensor may be fed to hardware, software, firmware or a combination of the same to map the touch gesture of a user's hand on the screen or surface to a corresponding dynamic behavior of a virtual object. The sensor date may be used to momentum and inertia factors to allow a variety of momentum behavior for a virtual object based on input from the user's hand, such as a swipe rate of a user's finger relative to the screen. Pinching gestures may be interpreted as a command to lift a virtual object from the display screen, or to begin generating a virtual binding associated with the virtual object or to zoom in or out on a display. Similar commands may be generated by Object and Gesture Recognition System 722, using one or more cameras, without the benefit of a touch surface.

Direction of Attention Module 723 may be equipped with cameras or other sensors to track the position or orientation of a user's face or hands. When a gesture or voice command is issued, the system can determine the appropriate screen for the gesture. In one example, a camera is mounted near each display to detect whether the user is facing that display. If so, then the direction of attention module information is provided to Object and Gesture Recognition Module 722 to ensure that the gestures or commands are associated with the appropriate library for the active display. Similarly, if the user is looking away from all of the screens, then commands can be ignored.

Device Proximity Detection Module 725 can use proximity sensors, compasses, GPS (global positioning system) receivers, personal area network radios, and other types of sensors, together with triangulation and other techniques to determine the proximity of other devices. Once a nearby device is detected, it can be registered to the system and its type can be determined as an input device or a display device or both. For an input device, received data may then be applied to Object Gesture and Recognition System 722. For a display device, it may be considered by Adjacent Screen Perspective Module 707.

Virtual Object Behavior Module 704 is adapted to receive input from Object Velocity and Direction Module 703, and to apply such input to a virtual object being shown in the display. Thus, for example, Object and Gesture Recognition System 722 would interpret a user gesture and by mapping the captured movements of a user's hand to recognized movements, Virtual Object Tracker Module 706 would associate the virtual object's position and movements to the movements as recognized by Object and Gesture Recognition System 722, Object and Velocity and Direction Module 703 would capture the dynamics of the virtual object's movements, and Virtual Object Behavior Module 704 would receive the input from Object and Velocity and Direction Module 703 to generate data that would direct the movements of the virtual object to correspond to the input from Object and Velocity and Direction Module 703.

Virtual Object Tracker Module 706 on the other hand may be adapted to track where a virtual object should be located in three-dimensional space in a vicinity of a display, and which body part of the user is holding the virtual object, based on input from Object Gesture and Recognition System 722. Virtual Object Tracker Module 706 may for example track a virtual object as it moves across and between screens and track which body part of the user is holding that virtual object. Tracking the body part that is holding the virtual object allows a continuous awareness of the body part's air movements, and thus an eventual awareness as to whether the virtual object has been released onto one or more screens.

Gesture to View and Screen Synchronization Module 708, receives the selection of the view and screen or both from Direction of Attention Module 723 and, in some cases, voice commands to determine which view is the active view and which screen is the active screen. It then causes the relevant gesture library to be loaded for Object and Gesture Recognition System 722. Various views of an application on one or more screens can be associated with alternative gesture libraries or a set of gesture templates for a given view.

Adjacent Screen Perspective Module 707, which may include or be coupled to Device Proximity Detection Module 725, may be adapted to determine an angle and position of one display relative to another display. A projected display includes, for example, an image projected onto a wall or screen. The ability to detect a proximity of a nearby screen and a corresponding angle or orientation of a display projected therefrom may for example be accomplished with either an infrared emitter and receiver, or electromagnetic or photo-detection sensing capability. For technologies that allow projected displays with touch input, the incoming video can be analyzed to determine the position of a projected display and to correct for the distortion caused by displaying at an angle. An accelerometer, magnetometer, compass, or camera can be used to determine the angle at which a device is being held while infrared emitters and cameras could allow the orientation of the screen device to be determined in relation to the sensors on an adjacent device. Adjacent Screen Perspective Module 707 may, in this way, determine coordinates of an adjacent screen relative to its own screen coordinates. Thus, the Adjacent Screen Perspective Module may determine which devices are in proximity to each other, and further potential targets for moving one or more virtual object's across screens. Adjacent Screen Perspective Module 707 may further allow the position of the screens to be correlated to a model of three-dimensional space representing all of the existing objects and virtual objects.

Object and Velocity and Direction Module 703 may be adapted to estimate the dynamics of a virtual object being moved, such as its trajectory, velocity (whether linear or angular), momentum (whether linear or angular), etc. by receiving input from Virtual Object Tracker Module 706. The Object and Velocity and Direction Module 703 may further be adapted to estimate dynamics of any physics forces, by for example estimating the acceleration, deflection, degree of stretching of a virtual binding, etc. and the dynamic behavior of a virtual object once released by a user's body part. Object and Velocity and Direction Module 703 may also use image motion, size and angle changes to estimate the velocity of objects, such as the velocity of hands and fingers Momentum and Inertia Module 702 can use image motion, image size, and angle changes of objects in the image plane or in a three-dimensional space to estimate the velocity and direction of objects in the space or on a display. Momentum and Inertia Module 702 is coupled to Object and Gesture Recognition System 722 to estimate the velocity of gestures performed by hands, fingers, and other body parts and then to apply those estimates to determine momentum and velocities to virtual objects that are to be affected by the gesture.

3D Image Interaction and Effects Module 705 tracks user interaction with 3D images that appear to extend out of one or more screens. The influence of objects in the z-axis (towards and away from the plane of the screen) can be calculated together with the relative influence of these objects upon each other. For example, an object thrown by a user gesture can be influenced by 3D objects in the foreground before the virtual object arrives at the plane of the screen. These objects may change the direction or velocity of the projectile or destroy it entirely. The object can be rendered by the 3D Image Interaction and Effects Module 705 in the foreground on one or more of the displays.

In a first example embodiment, a method comprises displaying, using a projector of a capture device, a fiducial projection pattern in response to calibration of the capture device; capturing, with a camera of the capture, an image of the fiducial projection pattern; determining calibration coefficient values indicative of relative physical relationships of one or more components of the depth camera system based on analysis of the captured image of the fiducial projection pattern; and applying the calibration coefficient values to the capture device for depth reconstruction performed by the capture device.

In another example embodiment of the method, the projector is an infrared (IR) projector that displays the fiducial projection pattern in a light invisible to a user of the capture device, and wherein the camera is an IR camera.

In another example embodiment, the method comprises generating, using the IR projector, the display of a diffuser projection pattern as the fiducial projector pattern with a diffuser optical element placed over the IR projector.

In another example embodiment of the method, the diffuser optical element is configured to generate an IR projector pattern having a pattern of IR spots with different light intensities.

In another example embodiment, the method comprises generating, using the IR projector, the display of a diffraction projection pattern as the fiducial projection pattern with a diffraction optical element placed over the IR projector.

In another example embodiment of the method, the diffraction optical element is a glass optical element etched with the diffraction fiducial projection pattern.

In another example embodiment of the method, the IR projector is a vertical-cavity surface-emitting laser (VCSEL) projector configured to display the fiducial projection pattern, and the method further comprises generating, using the VCSEL projector, the display of a VCSEL projection pattern as the fiducial projection pattern, wherein a plurality of IR emission light sources of the VCSEL projector are selectively activated to produce the fiducial projection pattern.

In another example embodiment, a series of two or more different VCSEL projection patterns are generated by the VCSEL projector and captured by the IR camera, and the method further comprises determining a first set of calibration coefficient values indicative of the relative physical relationships of the one or more components of the depth camera system based on analysis of a captured image of a first VCSEL projection pattern, and generating a refined set of calibration coefficient values based on the first set of calibration coefficient values and a determined second set of calibration coefficient values, the second set of calibration coefficient values indicative of the relative physical relationships of the one or more components of the depth camera system and based on analysis of a captured image of a second VCSEL projection pattern, and applying the refined set of calibration coefficient values to the capture device for depth reconstruction performed by the capture device.

In another example embodiment of the method, the calibration coefficient values are indicative of a relative distance, angle, orientation, offset, or combination thereof between one or more of the components of the capture device.

In another example embodiment of the method, the calibration of the capture device is performed in response to a user request.

In a second example embodiment, an article of manufacture having one or more non-transitory computer readable storage media storing instructions, which when executed by a system, cause the system to perform a method comprising displaying, using a projector of a capture device, a fiducial projection pattern in response to calibration of the capture device; capturing, with a camera of the capture, an image of the fiducial projection pattern; determining calibration coefficient values indicative of relative physical relationships of one or more components of the depth camera system based on analysis of the captured image of the fiducial projection pattern; and applying the calibration coefficient values to the capture device for depth reconstruction performed by the capture device.

In another example embodiment of the article of manufacture, the projector is an infrared (IR) projector that displays the fiducial projection pattern in a light invisible to a user of the capture device, and wherein the camera is an IR camera.

In another example embodiment, the article of manufacture further comprises generating, using the IR projector, the display of a diffuser projection pattern as the fiducial projector pattern with a diffuser optical element placed over the IR projector.

In another example embodiment of the article of manufacture, the diffuser optical element is configured to generate an IR projector pattern having a pattern of IR spots with different light intensities.

In another example embodiment, the article of manufacture further comprises generating, using the IR projector, the display of a diffraction projection pattern as the fiducial projection pattern with a diffraction optical element placed over the IR projector.

In another example embodiment of the article of manufacture, the diffraction optical element is a glass optical element etched with the diffraction fiducial projection pattern.

In another example embodiment of the article of manufacture, the IR projector is a vertical-cavity surface-emitting laser (VCSEL) projector configured to display the fiducial projection pattern, and the article of manufacture further comprises generating, using the VCSEL projector, the display of a VCSEL projection pattern as the fiducial projection pattern, wherein a plurality of IR emission light sources of the VCSEL projector are selectively activated to produce the fiducial projection pattern.

In another example embodiment of the article of manufacture, a series of two or more different VCSEL projection patterns are generated by the VCSEL projector and captured by the IR camera, the article of manufacture further comprises determining a first set of calibration coefficient values indicative of the relative physical relationships of the one or more components of the depth camera system based on analysis of a captured image of a first VCSEL projection pattern, and generating a refined set of calibration coefficient values based on the first set of calibration coefficient values and a determined second set of calibration coefficient values, the second set of calibration coefficient values indicative of the relative physical relationships of the one or more components of the depth camera system and based on analysis of a captured image of a second VCSEL projection pattern; and applying the refined set of calibration coefficient values to the capture device for depth reconstruction performed by the capture device.

In another example embodiment of the article of manufacture, the calibration coefficient values are indicative of a relative distance, angle, orientation, offset, or combination thereof between one or more of the components of the capture device.

In another example embodiment of the article of manufacture, the calibration of the capture device is performed in response to a user request.

In a third example embodiment, a capture device comprises a memory; a projector to display a fiducial projection pattern in response to calibration of the capture device; a camera to capture an image of the fiducial projection pattern and store the captured image in the memory; and a processor configured to determine calibration coefficient values indicative of relative physical relationships of one or more components of the capture device based on analysis of the captured image of the fiducial projection pattern, and apply the calibration coefficient values to the capture device for depth reconstruction performed by the capture device.

In another example embodiment of the capture device, the projector is an infrared (IR) projector that displays the fiducial projection pattern in a light invisible to a user of the capture device, and wherein the camera is an IR camera.

In another example embodiment of the capture device, the processor is configured to generate, using the IR projector, the display of a diffuser projection pattern as the fiducial projector pattern with a diffuser optical element placed over the IR projector.

In another example embodiment of the capture device, the diffuser optical element is configured to generate an IR projector pattern having a pattern of IR spots with different light intensities.

In another example embodiment of the capture device, the processor is configured to generate, using the IR projector, the display of a diffraction projection pattern as the fiducial projection pattern with a diffraction optical element placed over the IR projector.

In another example embodiment of the capture device, the diffraction optical element is a glass optical element etched with the diffraction fiducial projection pattern.

In another example embodiment of the capture device, the IR projector is a vertical-cavity surface-emitting laser (VCSEL) projector configured to display the fiducial projection pattern, and the processor is further configured to generate, using the VCSEL projector, the display of a VCSEL projection pattern as the fiducial projection pattern, wherein a plurality of IR emission light sources of the VCSEL projector are selectively activated to produce the fiducial projection pattern.

In another example embodiment of the capture device, a series of two or more different VCSEL projection patterns are generated by the VCSEL projector and captured by the IR camera, and the processor is further configured to determine a first set of calibration coefficient values indicative of the relative physical relationships of the one or more components of the depth camera system based on analysis of a captured image of a first VCSEL projection pattern, generate a refined set of calibration coefficient values based on the first set of calibration coefficient values and a determined second set of calibration coefficient values, the second set of calibration coefficient values indicative of the relative physical relationships of the one or more components of the depth camera system and based on analysis of a captured image of a second VCSEL projection pattern, and apply the refined set of calibration coefficient values to the capture device for depth reconstruction performed by the capture device.

In another example embodiment of the capture device, the calibration coefficient values are indicative of a relative distance, angle, orientation, offset, or combination thereof between one or more of the components of the capture device.

In another example embodiment of the capture device, the calibration of the capture device is performed in response to a user request.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

What is claimed is:

1. A method comprising:
   displaying, using a projector of a capture device, a fiducial projection pattern in response to calibration of the capture device, wherein the fiducial projection pattern is a known image having known properties for elements displayed within the known image;
   capturing, with a camera of the capture device, an image of the fiducial projection pattern;
   determining calibration coefficient values indicative of relative physical relationships of one or more components of the capture device based on analysis of the captured image and the known properties for the elements of the fiducial projection pattern; and
   applying the calibration coefficient values to the capture device for depth reconstruction performed by the capture device.

2. The method of claim 1, wherein the projector is an infrared (IR) projector that displays the fiducial projection pattern in a light invisible to a user of the capture device, and wherein the camera is an IR camera.

3. The method of claim 2, further comprising:
   generating, using the IR projector, the display of a diffuser projection pattern as the fiducial projector pattern with a diffuser optical element placed over the IR projector.

4. The method of claim 3, wherein the diffuser optical element is configured to generate an IR projector pattern having a pattern of IR spots with different light intensities.

5. The method of claim 2, further comprising:
   generating, using the IR projector, the display of a diffraction projection pattern as the fiducial projection pattern with a diffraction optical element placed over the IR projector.

6. The method of claim 5, wherein the diffraction optical element is a glass optical element etched with the diffraction fiducial projection pattern.

7. The method of claim 2, wherein the IR projector is a vertical-cavity surface-emitting laser (VCSEL) projector configured to display the fiducial projection pattern, further comprising:
   generating, using the VCSEL projector, the display of a VCSEL projection pattern as the fiducial projection pattern, wherein a plurality of IR emission light sources of the VCSEL projector are selectively activated to produce the fiducial projection pattern.

8. A method comprising:
   displaying, using a projector of a capture device, a fiducial projection pattern when calibrating the capture device, wherein the projector is an infrared (IR) projector comprising a vertical-cavity surface-emitting laser (VCSEL) projector configured to display the fiducial projection pattern in a light invisible to a user of the capture device, further comprising the VCSEL projector generating the display of a VCSEL projection pattern as the fiducial projection pattern, wherein a plurality of IR emission light sources of the VCSEL projector are selectively activated to produce the fiducial projection pattern;

capturing, with a camera of the capture, an image of the fiducial projection pattern, wherein the camera is an IR camera;

determining calibration coefficient values indicative of relative physical relationships of one or more components of the capture device based on analysis of the captured image of the fiducial projection pattern; and applying the calibration coefficient values to the capture device for depth reconstruction performed by the capture device, wherein a series of two or more different VCSEL projection patterns are generated by the VCSEL projector and captured by the IR camera, further comprising:

determining a first set of calibration coefficient values indicative of the relative physical relationships of the one or more components of the capture device based on analysis of a captured image of a first VCSEL projection pattern;

generating a refined set of calibration coefficient values based on the first set of calibration coefficient values and a determined second set of calibration coefficient values, the second set of calibration coefficient values indicative of the relative physical relationships of the one or more components of the capture device and based on analysis of a captured image of a second VCSEL projection pattern; and applying the refined set of calibration coefficient values to the capture device for depth reconstruction performed by the capture device.

9. The method of claim 1, wherein the calibration coefficient values are indicative of a relative distance, angle, orientation, offset, or combination thereof between one or more of the components of the capture device.

10. The method of claim 1, wherein the calibration of the capture device is performed in response to a user request.

11. An article of manufacture having one or more non-transitory computer readable storage media storing instructions, which when executed by a system, cause the system to perform a method comprising:

displaying, using a projector of a capture device, a fiducial projection pattern in response to calibration of the capture device, wherein the fiducial projection pattern is a known image having known properties for elements displayed within the known image;

capturing, with a camera of the capture device, an image of the fiducial projection pattern;

determining calibration coefficient values indicative of relative physical relationships of one or more components of the capture device based on analysis of the captured image and the known properties for the elements of the fiducial projection pattern; and applying the calibration coefficient values to the capture device for depth reconstruction performed by the capture device.

12. The article of manufacture of claim 11, wherein the projector is an infrared (IR) projector that displays the fiducial projection pattern in a light invisible to a user of the capture device, and wherein the camera is an IR camera.

13. The article of manufacture of claim 12, further comprising:

generating, using the IR projector, the display of a diffuser projection pattern as the fiducial projector pattern with a diffuser optical element placed over the IR projector.

14. The article of manufacture of claim 12, further comprising:

generating, using the IR projector, the display of a diffraction projection pattern as the fiducial projection pattern with a diffraction optical element placed over the IR projector.

15. The article of manufacture of claim 12, wherein the IR projector is a vertical-cavity surface-emitting laser (VCSEL) projector configured to display the fiducial projection pattern, further comprising:

generating, using the VCSEL projector, the display of a VCSEL projection pattern as the fiducial projection pattern, wherein a plurality of IR emission light sources of the VCSEL projector are selectively activated to produce the fiducial projection pattern.

16. A capture device:
a memory;
a projector to display a fiducial projection pattern in response to calibration of the capture device, wherein the fiducial projection pattern is a known image having known properties for elements displayed within the known image;
a camera to capture an image of the fiducial projection pattern and store the captured image in the memory; and
a processor configured to
determine calibration coefficient values indicative of relative physical relationships of one or more components of the capture device based on analysis of the captured image and the known properties for the elements of the fiducial projection pattern, and
apply the calibration coefficient values to the capture device for depth reconstruction performed by the capture device.

17. The capture device of claim 16, wherein the projector is an infrared (IR) projector that displays the fiducial projection pattern in a light invisible to a user of the capture device, and wherein the camera is an IR camera.

18. The capture device of claim 16, further comprising the processor configured to generate, using the IR projector, the display of a diffuser projection pattern as the fiducial projector pattern with a diffuser optical element placed over the IR projector.

19. The capture device of claim 16, further comprising the processor configured to generate, using the IR projector, the display of a diffraction projection pattern as the fiducial projection pattern with a diffraction optical element placed over the IR projector.

20. The capture device of claim 16, wherein the IR projector is a vertical-cavity surface-emitting laser (VCSEL) projector configured to display the fiducial projection pattern, further comprising the processor configured to generate, using the VCSEL projector, the display of a VCSEL projection pattern as the fiducial projection pattern, wherein a plurality of IR emission light sources of the VCSEL projector are selectively activated to produce the fiducial projection pattern.

* * * * *